United States Patent
Zhang

(10) Patent No.: US 11,854,881 B2
(45) Date of Patent: Dec. 26, 2023

(54) METHOD OF MAKING A METAL SILICIDE CONTACT TO A SILICON SUBSTRATE

(71) Applicant: CHANGXIN MEMORY TECHNOLOGIES, INC., Hefei (CN)

(72) Inventor: Biao Zhang, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 162 days.

(21) Appl. No.: 17/603,450

(22) PCT Filed: Jul. 29, 2021

(86) PCT No.: PCT/CN2021/109179
§ 371 (c)(1),
(2) Date: Oct. 13, 2021

(87) PCT Pub. No.: WO2022/198869
PCT Pub. Date: Sep. 29, 2022

(65) Prior Publication Data
US 2023/0064568 A1 Mar. 2, 2023

(30) Foreign Application Priority Data
Mar. 24, 2021 (CN) .......................... 202110313214.4

(51) Int. Cl.
*H01L 21/768* (2006.01)
*H01L 21/02* (2006.01)
(52) U.S. Cl.
CPC .. *H01L 21/76886* (2013.01); *H01L 21/02175* (2013.01); *H01L 21/02252* (2013.01); *H01L 21/76831* (2013.01)

(58) Field of Classification Search
CPC ......... H01L 21/28518; H01L 21/76856; H01L 21/76889
See application file for complete search history.

(56) References Cited

U.S. PATENT DOCUMENTS

| | | | |
|---|---|---|---|
| 7,902,056 B2 | 3/2011 | Enda et al. | |
| 10,490,647 B1 | 11/2019 | Zhang et al. | |
| 2008/0124923 A1 | 5/2008 | Jeon | |
| 2010/0081275 A1* | 4/2010 | Ishizaka | H01L 21/76883 438/653 |
| 2017/0077248 A1* | 3/2017 | Eom | H01L 21/845 |

(Continued)

FOREIGN PATENT DOCUMENTS

| | | |
|---|---|---|
| CN | 110676162 A | 1/2020 |
| CN | 110911265 A | 3/2020 |

(Continued)

OTHER PUBLICATIONS

Machine language translation of KR 2006-0016269. (Year: 2006).*
International Search Report cited in PCT/CN2021/109179, dated Dec. 2, 2021, 10 pages.

*Primary Examiner* — Erik Kielin
(74) *Attorney, Agent, or Firm* — Cooper Legal Group, LLC

(57) ABSTRACT

Embodiments of the present application relate to a method for manufacturing a semiconductor structure, includes: forming a contact metal layer on a silicon substrate; performing a plasma treatment process, and forming an oxygen isolation layer on a surface of the contact metal layer; and performing a silicidation reaction process, and converting the contact metal layer into a metal silicide layer.

14 Claims, 5 Drawing Sheets

(56) References Cited

U.S. PATENT DOCUMENTS

2020/0144073 A1\* 5/2020 Kuratomi .......... H01L 21/76895
2021/0090948 A1\* 3/2021 Chen ................ H01L 23/53223

FOREIGN PATENT DOCUMENTS

| CN | 113078102 A | 7/2021 |
|---|---|---|
| JP | 2009049207 A | 3/2009 |
| KR | 20060016269 A | 2/2006 |

\* cited by examiner

METHOD OF MAKING A METAL SILICIDE CONTACT TO A SILICON SUBSTRATE

CROSS-REFERENCE TO RELATED APPLICATIONS

The present application is a national stage entry of International Application No. PCT/CN2021/109179, filed on Jul. 29, 2021, which claims the priority to Chinese Patent Application 202110313214.4, titled "METHOD FOR MANUFACTURING SEMICONDUCTOR STRUCTURE", filed on Mar. 24, 2021. The entire contents of International Application No. PCT/CN2021/109179 and Chinese Patent Application 202110313214.4 are incorporated herein by reference.

TECHNICAL FIELD

The present application relates to the field of semiconductor technology, and in particular, to a method for manufacturing a semiconductor structure.

BACKGROUND

In the semiconductor process, cobalt interconnect is an important technology for connecting a metal with a non-metal. It can effectively reduce the contact resistance between the metal and the non-metal, thereby effectively improving device performance.

The metal silicidation process in the traditional technology is:

Cobalt is deposited under low temperature conditions, then exposed atmospheric oxygen atoms adhere to the surface of the cobalt film, and finally cobalt silicide is formed by high-temperature thermal annealing treatment. Although this process is relatively stable, an oxide layer is prone to form on the surface of the cobalt silicide during annealing in the presence of oxygen in the cobalt film, which tends to increase the contact resistance between the metal and the non-metal to affect device performance.

SUMMARY

According to various embodiments of the present application, a method for manufacturing a semiconductor structure is provided.

A method for manufacturing a semiconductor structure includes:

forming a contact metal layer on a silicon substrate;

performing a plasma treatment process, and forming an oxygen isolation layer on a surface of the contact metal layer; and performing a silicidation reaction process, and converting the contact metal layer into a metal silicide layer.

BRIEF DESCRIPTION OF THE DRAWINGS

In order to describe the technical solutions in the embodiments of this specification or in the prior art more clearly, the following briefly describes the accompanying drawings needed for describing the embodiments or the prior art. Apparently, the accompanying drawings in the following description show only some embodiments of this specification, and those of ordinary skill in the art may still derive other drawings from these accompanying drawings without any creative efforts.

DETAILED DESCRIPTION

Figure 1:
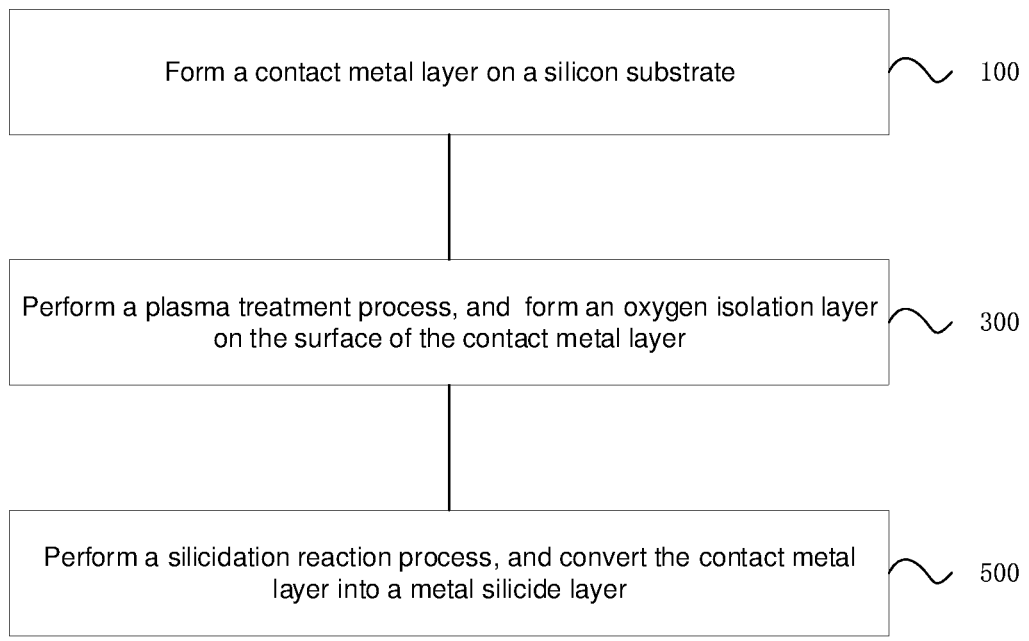
FIG. 1 is a step flowchart of a manufacturing method according to an embodiment of the present application.

In order to facilitate the understanding of the present application, the present application will be described more comprehensively below with reference to the relevant accompanying drawings. Preferred embodiments of the present application are shown in the drawings. However, the present application may be implemented in many different forms, and is not limited to the embodiments described herein. On the contrary, these embodiments are provided for a more thorough and comprehensive understanding of the disclosure of the present application.

It should be noted that when one element is referred to as being "fixed" to other element, the element may be directly located on the other element or a medium element may exist. When one element is considered to be "connected" to other element, the element may be directly connected to the other element or a medium element may exist simultaneously. The terms "vertical", "horizontal", "left", "right", "upper", "lower", "front", "back" and "circumferential" used herein and similar expressions are based on the orientations or positional relationships shown in the accompanying drawings, and are intended to facilitate the description of the present application and simplify the description only, rather than indicating or implying that the apparatus or element referred to must have a particular orientation or be constructed and operated in a particular orientation. Therefore, such terms and expressions cannot be interpreted as limitations to the present application.

Unless otherwise defined, all technological and scientific terms used herein have the same meanings as commonly understood by those of ordinary skill in the technical field of the present application. The terms used in the description of the present application are only for the purpose of describing specific embodiments, but are not intended to limit the present application. The term "and/or" used herein includes any and all combinations of one or more relevant listed items.

During the manufacturing process of an integrated circuit, Co/Ni/Ti is generally deposited on the surface of a silicon substrate through a deposition process, then cobalt silicide ($CoSi_x$)/nickel silicide ($NiSi_x$)/titanium silicide ($TiSi_x$) is formed through a thermal annealing process to reduce contact resistance, and finally a layer of thin film is deposited to prevent diffusion contamination of tungsten metal subsequently filled. However, during the formation of $CoSi_x/NiSi_x/TiSi_x$, a layer of $SiO_2$ is prone to form due to oxidation on the surface of $CoSi_x/NiSi_x/TiSi_x$, which increases the contact resistance and even may cause an open circuit in severe cases.

In order to avoid the formation of oxides on the surface of $CoSi_x/NiSi_x/TiSi_x$ to increase the contact resistance, cobalt may be deposited under high temperature conditions to form high-resistance phase cobalt silicide, then titanium nitride is deposited under high vacuum conditions to form an isolation layer for isolating oxygen, and low-resistance phase cobalt silicide is formed by thermal annealing treatment. However, the above method requires a titanium target during production, which results in relatively high cost and process complexity and is also not conducive to improving device yield.

Based on the above defects, the present application proposes an improved method for manufacturing a semiconductor structure, which achieves the purpose of isolating oxygen by forming an oxygen isolation layer on the surface of a contact metal layer, and includes: forming a contact metal layer on a silicon substrate; performing a plasma treatment process, and forming an oxygen isolation layer on the surface of the contact metal layer; and performing a silicidation reaction process, and converting the contact metal layer into a metal silicide layer. The manufacturing method can effectively reduce oxide defects in the metal-non-metal interconnect structure, improve device yield, and has simple process steps, which is beneficial to reducing the cost.

In order to make the above objectives, features and advantages of the present application more obvious and understandable, the specific embodiments of the present application will be described in detail below in conjunction with the accompanying drawings. It should be noted that these drawings are provided to help understand the embodiments of the present application, and should not be interpreted as improper limitations to the present application.

Referring to FIG. 1, a method for manufacturing a semiconductor structure according to the present application includes the following steps:

S100, a contact metal layer is formed on a silicon substrate.

Figure 2:
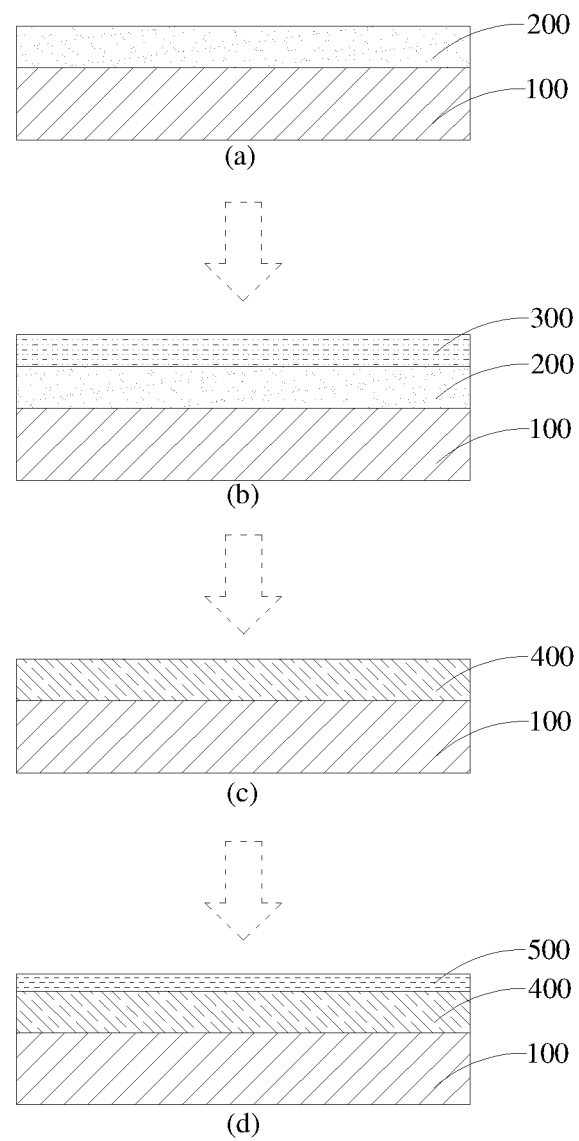
FIGS. 2 (a) to (d) are schematic diagrams illustrating various stages of forming a metal-non-metal interconnect structure according to the embodiment shown in FIG. 1.

Specifically, as shown in FIG. 2 (*a*), the silicon substrate 100 may include a polycrystalline silicon substrate or a monocrystalline silicon substrate, such as a silicon on insulator (SOI) substrate, a stacked silicon on insulator (SSOI) substrate, a stacked silicon germanium on insulator (S—SiGeOI) substrate, a silicon germanium on insulator (SiGeOI) substrate, or a germanium on insulator (GeOI) substrate.

S200, a plasma treatment process is performed, and form an oxygen isolation layer on the surface of the contact metal layer.

Specifically, as shown in FIG. 2 (*b*), a plasma may be introduced onto the surface of the contact metal layer 200, and the nitrogen-containing plasma reacts with the contact metal layer 200, thus forming the oxygen isolation layer 300 on the surface of the contact metal layer 200. The oxygen isolation layer 300 can effectively isolate oxygen and prevent the contact metal layer 200 from absorbing oxygen in the external environment, thereby avoiding the formation of an oxide layer in the subsequent process, which increases the contact resistance between the silicon substrate 100 and the metal.

In addition, a precursor may be introduced onto the surface of the contact metal layer 200 before the plasma is introduced, so that the precursor reacts with the plasma to form the oxygen isolation layer 300. As such, on the one hand, the oxygen isolation layer 300 with good oxygen isolation performance can be formed; and on the other hand, compared to the previous method for forming the oxygen isolation layer 300, the consumption of the contact metal layer 200 for forming the oxygen isolation layer 300 can be reduced, thereby ensuring the subsequent forming quantity of metal silicide.

S300, a silicidation reaction process is performed, and convert the contact metal layer into a metal silicide layer.

Specifically, as shown FIG. 2(*c*), after the silicidation reaction is performed, the contact metal layer 200 can be converted into the metal silicide layer 400. Since the oxygen isolation layer 300 is formed on the surface of the contact metal layer 200 first, the increase of oxygen in the contact metal layer 200 can be reduced, which reduces the formation of an oxide layer on the surface of the contact metal layer 200 later and then reduces the contact resistance.

The silicidation reaction process may include a heat treatment process. In step S200, an oxygen isolation layer 300 with thermal instability is preferably formed. As such, the oxygen isolation layer 300 can not only isolate the contact metal layer 200 from oxygen, but also can be removed in the subsequent heat treatment process, without increasing the height of the semiconductor structure or affecting device performance.

In the above-mentioned method for manufacturing the semiconductor structure, an oxygen isolation layer 300 is formed on the surface of the contact metal layer 200 through a plasma process to achieve the purpose of isolating oxygen, thereby reducing the formation of an oxide layer on the surface of the metal silicide layer 400 later, then reducing the contact resistance between the metal and the non-metal, and improving device yield; on the other hand, the manufacturing method has simple process steps, is beneficial to improving the use efficiency of equipment, and avoids the use of metal targets to reduce production costs.

In one embodiment, the material of the contact metal layer includes cobalt, and step S300 includes: introducing a nitrogen-containing plasma onto the surface of the contact metal layer, and the nitrogen-containing plasma reacting with the contact metal layer, so as to form the oxygen isolation layer on the surface of the contact metal layer.

Specifically, continuing to refer to FIG. 2, a cobalt layer (that is, the contact metal layer 200) may be formed on the silicon substrate 100 through a deposition process, a reducing nitrogen-containing plasma is introduced onto the surface of the cobalt layer, and the nitrogen-containing plasma reacts with the cobalt layer so as to form a cobalt nitride layer (that is, the oxygen isolation layer 300), and then a silicidation reaction process (that is, heat treatment on the cobalt layer) is performed to convert the cobalt layer into a cobalt silicide layer (that is, the metal silicide layer 400), which facilitates the subsequent connection of the metal to the silicon substrate 100 and reduces the contact resistance between the metal and the silicon substrate 100. Meanwhile, cobalt nitride with thermal instability is easily decomposed into cobalt and nitrogen in the subsequent heat treatment process, so the cobalt nitride used as the oxygen isolation layer 300 can isolate the contact metal layer 200 from oxygen, and can also be decomposed and removed in the subsequent heat treatment process, without increasing the height of the semiconductor structure or affecting device performance. In addition, the oxygen isolation layer 300 of the present application can be formed without using a titanium target, which is also beneficial to reducing the manufacturing cost.

In another embodiment, the material of the contact metal layer includes cobalt, and before step S300, the method further includes: introducing a cobalt-containing precursor onto the surface of the contact metal layer, and the cobalt-containing precursor reacting with the nitrogen-containing plasma so as to generate cobalt nitride (the oxygen isolation layer).

Specifically, after the cobalt layer is deposited, the cobalt-containing precursor may be introduced onto the surface of the cobalt layer, then the reducing nitrogen-containing plasma is introduced, the cobalt-containing precursor reacts with the nitrogen-containing plasma to generate a cobalt nitride layer, and the silicidation reaction process (that is, heat treatment on the cobalt layer) is performed, and convert the cobalt layer into a cobalt silicide layer. The cobalt-containing precursor used to form cobalt nitride, on the one hand, is beneficial to forming the oxygen isolation layer 300 with good oxygen isolation performance. On the other hand, the cobalt nitride with thermal instability is easily decomposed into cobalt and nitrogen, so compared to the previous method for forming the oxygen isolation layer 300, the cobalt-containing precursor is beneficial to reducing the consumption of the cobalt layer for forming cobalt nitride, thereby ensuring the subsequent forming quantity of cobalt silicide. Further, the cobalt-containing precursor may be deposited on the surface of the cobalt layer by chemical vapor deposition (CVD). The material of the cobalt-containing precursor may be dicobalt hexacarbonyl (CCTBA) or cobalt tricarbonyl nitrosyl (Co (CO)$_3$NO), those skilled in the art may choose the material according to the actual situation, and the present application does not limit this.

Further, the X value in the Co$_x$N layer and the thickness of Co$_x$N may be adjusted by adjusting the ratio of the cobalt-containing precursor to the nitrogen-containing plasma and the treatment time, and finally Co$_x$N with a thickness of 1 nm to 5 nm may be formed. In one embodiment, the thickness of Co$_x$N may be 2 to 3 nm. By controlling the thickness of Co$_x$N to satisfy the above relationship, an oxygen isolation layer can be formed to achieve good oxygen isolation effect, the reaction time can be reduced, and the consumption of plasma can be reduced to reduce the manufacturing cost.

In one embodiment, the plasma treatment process is performed at a first temperature, the silicidation reaction process is performed at a second temperature, and the first temperature is less than the second temperature. Specifically, continuing to refer to FIG. 2, still taking the contact metal layer 200 that is a cobalt layer as an example, the oxygen isolation layer 300 is cobalt nitride, the treatment temperature (that is, the first temperature) of the nitrogen-containing plasma process may be 100° C. to 300° C., and preferably, the first temperature is 200° C.; the flow rate of the nitrogen-containing plasma introduced may be 3000 sccm to 5000 sccm, the process time may be 5 s to 20 s, and the power of introducing the plasma may be 500 W to 1000 W; the thermal decomposition temperature for cobalt nitride may be 300° C. to 400° C.; the heat treatment temperature (that is, the second temperature) of the silicidation reaction process may be 500° C. to 900° C. It can be seen that the first temperature is lower than the thermal decomposition temperature of cobalt nitride, and the second temperature is significantly higher than the thermal decomposition temperature of cobalt nitride, so that the cobalt nitride can be formed on the cobalt layer by the plasma treatment process at the first temperature, and can be completely removed by sufficient thermal decomposition when the silicidation reaction process is performed at the second temperature. As such, the cobalt nitride can not only isolate the cobalt layer from oxygen, but also can be removed in the subsequent heat treatment process, without increasing the height of the semiconductor structure or affecting device performance.

Figure 3:
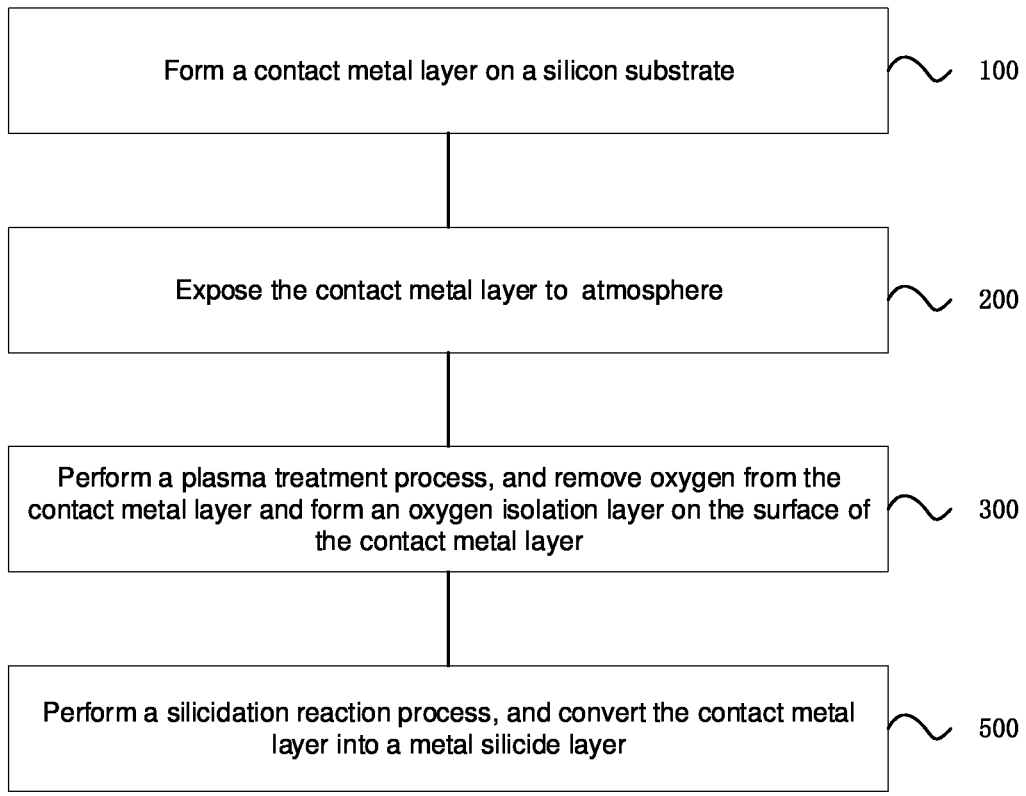
FIG. 3 is a step flowchart of a manufacturing method according to another embodiment of the present application.

In one embodiment, referring to FIG. 3, after forming the contact metal layer on the silicon substrate, and before performing the plasma treatment process, when the contact metal layer is exposed to atmosphere, the manufacturing method further includes performing the plasma treatment process, and removing oxygen from the contact metal layer.

Figure 4:
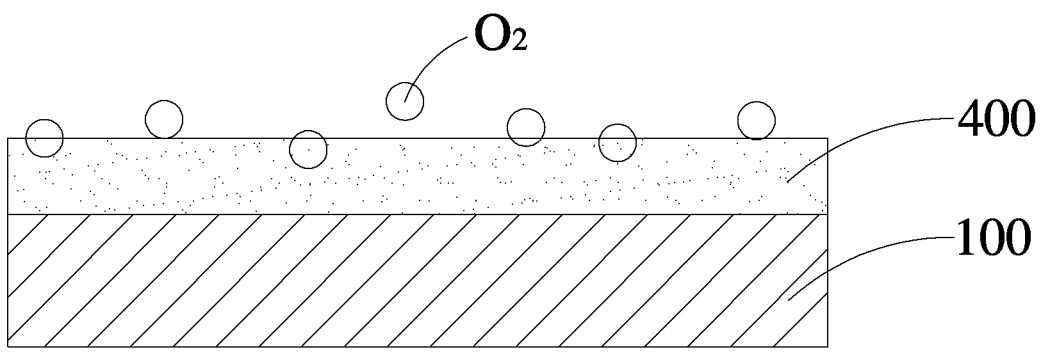
FIG. 4 is a schematic structure diagram during atmospheric exposure according to the embodiment shown in FIG. 3.

Specifically, as shown in FIG. 4, after the contact metal layer 200 is formed, the contact metal layer 200 is exposed to atmosphere for a period of time. Taking the cobalt layer as the contact metal layer 200 as an example, because cobalt has oxygen absorption characteristics, when the cobalt layer is exposed to atmosphere, oxygen molecules enter the cobalt layer or adhere to the surface of the cobalt layer. Therefore, if oxygen in the cobalt layer is not removed and the oxygen isolation layer 300 (such as cobalt nitride) is formed on the surface of the cobalt layer, an oxide layer is easily generated in the subsequent silicidation reaction process to increase the contact resistance. After the reducing plasma is introduced, the oxygen in the cobalt layer can be removed by an oxidation-reduction reaction, and the plasma reacts with the cobalt layer to form a cobalt nitride layer (that is, the oxygen isolation layer). In the solution of forming the oxygen isolation layer by using the cobalt-containing precursor, the nitrogen-containing plasma may be introduced for a relatively long time to completely remove the oxygen from the cobalt layer through the oxidation-reduction reaction, thereby achieving the purpose of isolating oxygen.

Further, the oxygen in the cobalt layer may be removed using ammonia plasma, and the specific reaction formula can be expressed as follows:

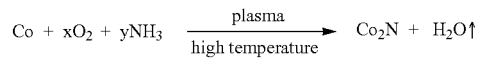

It can be seen that cobalt can react with oxygen and ammonia plasma at a high temperature to generate cobalt nitride and water vapor, thereby effectively removing oxygen from the cobalt layer. The generated cobalt nitride adheres to the surface of the cobalt layer, and can be thermally decomposed to form cobalt and other products during the silicidation reaction, which can achieve an oxygen isolation effect and reduce the consumption of cobalt.

Figure 5:
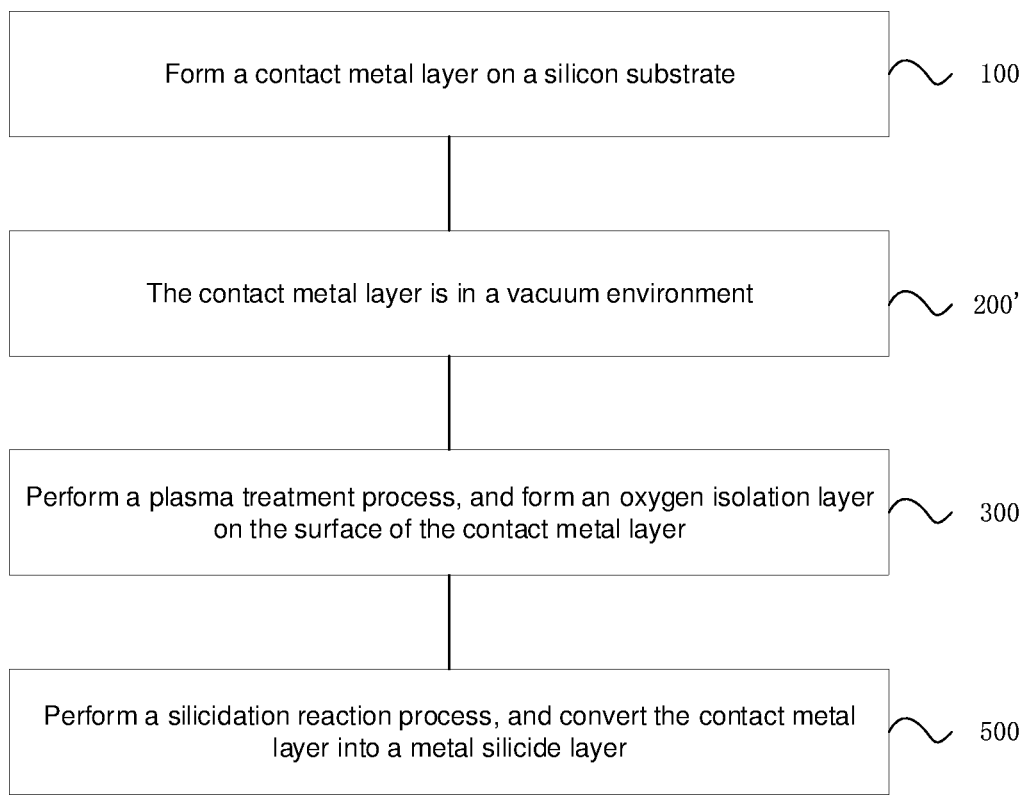
FIG. 5 is a step flowchart of a manufacturing method according to still another embodiment of the present application.

In another embodiment, as shown in FIG. 5, after forming the contact metal layer on the silicon substrate, before performing the plasma treatment process, the contact metal layer is in a vacuum environment. By placing the semiconductor structure deposited with the contact metal layer in the vacuum environment, the absorption of oxygen in the contact metal layer can be avoided, so the oxygen does not need to be removed from the contact metal layer. The plasma can directly react with the contact metal layer or react with the precursor to form an oxygen isolation layer on the surface of the contact metal layer, which is beneficial to saving the quantity of plasma introduced and reducing the manufacturing cost.

In one embodiment, step S100 includes: forming a contact window on the silicon substrate, and forming the contact metal layer on the side walls and bottom surface of the contact window through a deposition process.

Figure 6:
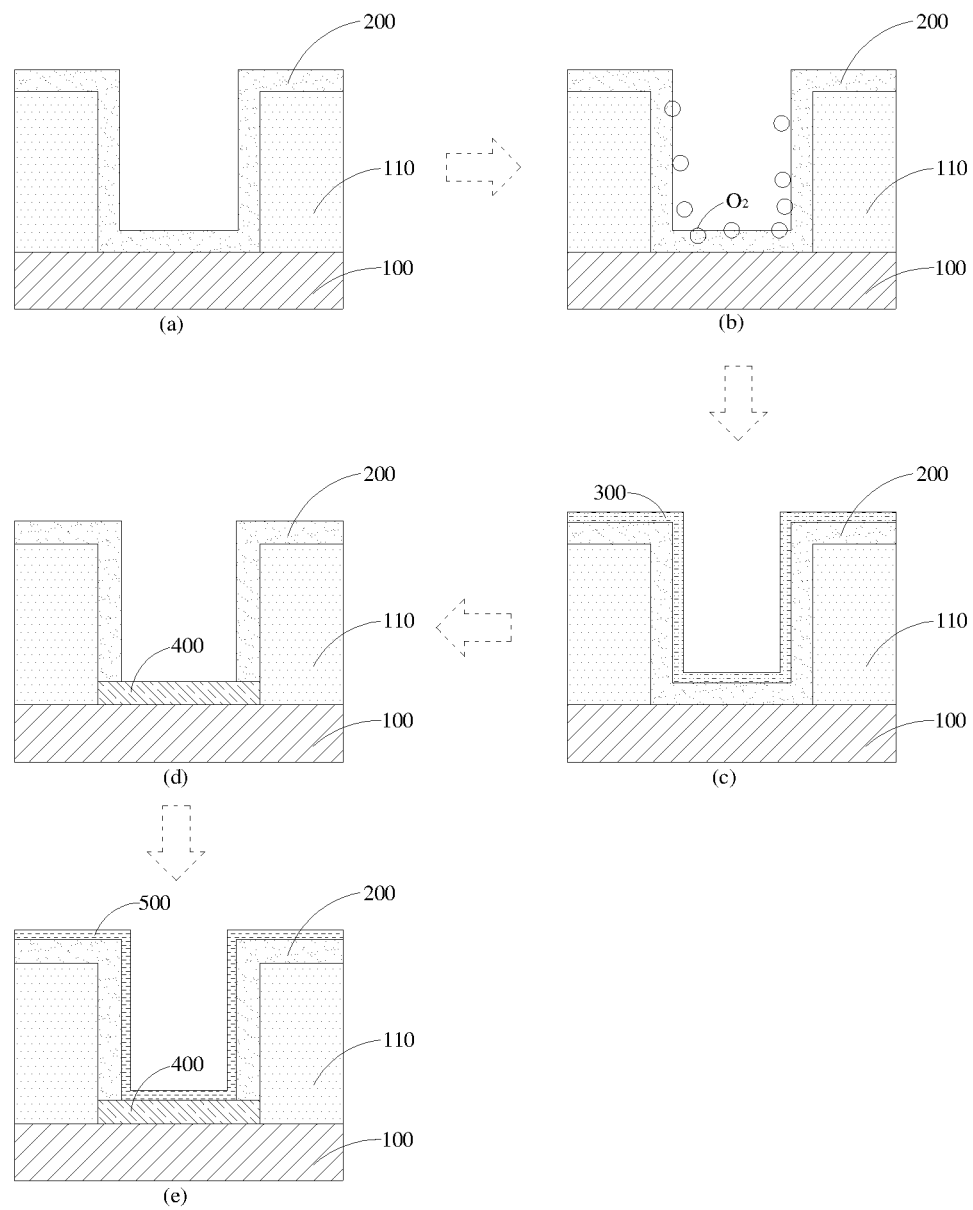
FIGS. 6 (a) to (e) are schematic diagrams illustrating various stages of forming a metal-non-metal interconnect structure according to another embodiment of the present application.

Specifically, as shown in FIG. 6 (a), the contact window is formed on the silicon substrate 100, the contact window includes the silicon substrate 100 arranged on the bottom of the contact window and a dielectric layer 110 arranged on two sides of the contact window, a contact metal layer 200 is formed on the side walls and bottom surface of the contact window through a deposition process, and the material of the contact metal layer 200 is cobalt. The deposition process includes any one of physical vapor deposition, chemical vapor deposition and atomic layer deposition.

Further, the contact window may be manufactured according to the following method. First, the silicon substrate 100 is provided, and then a photolithography mask is provided. The photomask has an opaque photomask pattern and a partial exposure pattern located around the opaque photomask pattern. A photoresist material layer is exposed through the photomask. Next, the exposed photoresist material layer is developed to form a patterned photoresist layer. After that, a substrate material layer is etched using the patterned photoresist layer as an etching mask to form a patterned material layer. Finally, the patterned photoresist layer is removed. It is worth noting that the patterned photoresist layer is a patterned photoresist layer with side walls, which is produced by partially exposing the photoresist material layer through a partial exposure pattern during the exposure to change the amount of exposure around the opaque photomask pattern. In a preferred embodiment, the partial exposure pattern is, for example, composed of at least one strip shading pattern. The photomask has an opaque photomask pattern and two partial exposure patterns located around the opaque photomask pattern. Each partial exposure pattern has, for example, a strip shading pattern. Through the partial exposure patterns, the amount of exposure at the edge of the opaque photomask pattern can be changed, and then the edge of the photoresist material layer can be partially exposed, and form the patterned photoresist layer with inclined side walls. Of course, each partial exposure pattern may include a plurality of strip shading patterns, and is not limited to the single strip shading pattern. The partial exposure pattern on the photomask may also be composed of a plurality of block shading patterns, which are arranged in the partial exposure pattern to control the amount of exposure so as to form a partial exposure effect. It is understandable that the strip shading pattern or the block shading pattern may also be in any other shape, as long as a partial exposure effect can be achieved around the opaque shading pattern.

Further, as shown in FIG. 6 (b), the contact metal layer 200 is exposed to atmosphere, and oxygen molecules enter the contact metal layer 200 or adhere to the surface of the contact metal layer 200. Further, as shown in FIG. 6 (c), a plasma treatment process is performed, and form an oxygen isolation layer 300 on the surface of the contact metal layer 200. Further, as shown in FIG. 6 (d), a silicidation reaction process is performed, and convert the contact metal layer 200 into a metal silicide layer 400. In a preferred embodiment, the material of the contact metal layer 200 includes cobalt, the plasma includes nitrogen-containing plasma, and the nitrogen-containing plasma can react with the contact metal layer 200 to generate cobalt nitride as the oxygen isolation layer 300. The cobalt nitride with thermal instability is easily decomposed into cobalt and nitrogen in the subsequent heat treatment process, so the cobalt nitride used as the oxygen isolation layer 300 can isolate the contact metal layer 200 from oxygen, and can also be decomposed and removed in the subsequent heat treatment process, without increasing the height of the semiconductor structure or affecting device performance. In another preferred embodiment, the material of the contact metal layer 200 includes cobalt, and a cobalt-containing precursor may be introduced onto the surface of the contact metal layer 200 to react with the nitrogen-containing plasma so as to generate cobalt nitride. As such, the amount of metal silicide on the silicon substrate 100 at the bottom of the contact window can be increased, and cobalt can also be formed on the side walls of the contact window. In this way, when the subsequent metal is deposited in the contact window, the electron migration of copper can be effectively suppressed.

In an embodiment, after step S300, the method further includes the following step:

S400, a barrier layer is deposited on the metal silicide layer.

In order to avoid the diffusion of ions in the substrate to the subsequently deposited metal (for example, copper), the barrier layer may be arranged between the metal and the metal silicide layer, to block ion migration, so as to ensure device performance. Specifically, the barrier layer may be titanium nitride. On the other hand, the titanium nitride also helps to improve the adhesion effect between the metal and the contact metal layer 200 and the metal silicide layer 400. Taking FIG. 2 (d) as an example, in order to block ion migration and improve the adhesion effect between the metal silicide layer 400 and the subsequently deposited metal, a barrier layer 500 may be deposited on the metal silicide layer 400; taking FIG. 6 (e) an example, in the contact window, in order to block ion migration and improve the adhesion effect between the unreacted contact metal layer 200, the metal silicide layer 400 and the subsequently deposited metal, a barrier layer 500 may be deposited on the metal silicide layer 400.

In another embodiment, a cleaning reaction may be performed first to remove the remaining part of contact metal layer 200, and then the barrier layer 500 is deposited on the metal silicide layer 400. Through the cleaning reaction, the unreacted contact metal layer 200 and the unreacted oxygen isolation layer 300 can be removed, which is beneficial to reducing device thickness and further ensuring device performance. It is understandable that those skilled in the art can choose whether to remove the unreacted contact metal layer 200 and the unreacted oxygen isolation layer 300 according to the actual situation, which is not limited in the present application.

The technical features of the above embodiments may be combined arbitrarily. For the purpose of simplicity in description, all possible combinations of the technical features in the above embodiments are not described. However, as long as the combinations of these technical features do not have contradictions, they shall fall within the scope of this specification.

The above-mentioned embodiments only describe several implementations of the present application, and their descriptions are specific and detailed, but cannot therefore be understood as limitations to the patent scope of the present application. It should be noted that those of ordinary skill in the art may further make variations and improvements without departing from the conception of the present application, and these all fall within the protection scope of the present application. Therefore, the patent protection scope of the present application should be subject to the appended claims.

The invention claimed is:

1. A method for manufacturing a semiconductor structure, comprising:
   forming a contact metal layer on a silicon substrate;
   introducing a cobalt-containing precursor onto a surface of the contact metal layer;
   performing a plasma treatment process to introduce a nitrogen-containing plasma onto the surface of the contact metal layer, wherein the cobalt-containing precursor reacts with the nitrogen-containing plasma introduced by the plasma treatment process to form an oxygen isolation layer on the surface of the contact metal layer; and performing a silicidation reaction process on the contact metal layer and the oxygen isolation layer to convert the contact metal layer into a metal silicide layer and thermally decompose the oxygen isolation layer through heat treatment during the silicidation reaction process to remove the oxygen isolation layer.

2. The method for manufacturing the semiconductor structure according to claim 1, wherein after converting the contact metal layer into the metal silicide layer, the method further comprises:

performing a cleaning reaction to remove a remaining part of the contact metal layer, and depositing a barrier layer on the metal silicide layer.

3. The method for manufacturing the semiconductor structure according to claim 1, wherein the plasma treatment process is performed at a first temperature, the silicidation reaction process is performed at a second temperature, and the first temperature is less than the second temperature.

4. The method for manufacturing the semiconductor structure according to claim 1, wherein the method further comprises:

after forming the contact metal layer on the silicon substrate, and before performing the plasma treatment process, in response to the contact metal layer being exposed to air, performing the plasma treatment process, and removing oxygen from the contact metal layer.

5. The method for manufacturing the semiconductor structure according to claim 1, wherein after forming the contact metal layer on the silicon substrate, before performing the plasma treatment process, the contact metal layer is in a vacuum environment.

6. The method for manufacturing the semiconductor structure according to claim 3, wherein the first temperature is 100° C. to 300° C.

7. The method for manufacturing the semiconductor structure according to claim 1, wherein converting the contact metal layer into the metal silicide layer comprises:

performing the heat treatment on the contact metal layer to convert the contact metal layer into the metal silicide layer.

8. The method for manufacturing the semiconductor structure according to claim 3, wherein the oxygen isolation layer has a preset thermal decomposition temperature, the preset thermal decomposition temperature is less than or equal to the second temperature.

9. The method for manufacturing the semiconductor structure according to claim 8, wherein the preset thermal decomposition temperature is 300° C. to 400° C., and the second temperature is 500° C. to 900° C.

10. The method for manufacturing the semiconductor structure according to claim 1, wherein a material of the contact metal layer comprises cobalt.

11. The method for manufacturing the semiconductor structure according to claim 1, wherein a material of the oxygen isolation layer comprises cobalt nitride.

12. The method for manufacturing the semiconductor structure according to claim 1, wherein the forming a contact metal layer on a silicon substrate comprises:

forming a contact window on the silicon substrate, and forming the contact metal layer on side walls and a bottom surface of the contact window through a deposition process.

13. The method for manufacturing the semiconductor structure according to claim 12, wherein the deposition process comprises any one of physical vapor deposition, chemical vapor deposition and atomic layer deposition.

14. The method for manufacturing the semiconductor structure according to claim 1, wherein after converting the contact metal layer into the metal silicide layer, the method further comprises:

depositing a barrier layer on the metal silicide layer.

* * * * *